US006770385B2

(12) United States Patent
Chen et al.

(10) Patent No.: US 6,770,385 B2
(45) Date of Patent: Aug. 3, 2004

(54) FLUORESCENT BIS-COUMARINS FOR ORGANIC LIGHT-EMITTING DEVICES

(75) Inventors: Jian Ping Chen, San Jose, CA (US); Travis P. S. Thoms, San Lorenzo, CA (US); Bing R. Hsieh, Webster, NY (US)

(73) Assignee: Canon Inc., Tokyo (JP)

( * ) Notice: Subject to any disclaimer, the term of this patent is extended or adjusted under 35 U.S.C. 154(b) by 0 days.

(21) Appl. No.: 10/040,764

(22) Filed: Jan. 9, 2002

(65) Prior Publication Data

US 2003/0164499 A1 Sep. 4, 2003

(51) Int. Cl.[7] .......................... H05B 33/14; C09K 11/06; C07D 311/06
(52) U.S. Cl. .................. 428/690; 428/917; 313/504; 252/301.16; 549/283; 549/284; 549/288
(58) Field of Search ................... 428/690, 917; 313/504; 252/301.16, 301.32; 549/283, 284, 285, 288

(56) References Cited

U.S. PATENT DOCUMENTS

| | | | |
|---|---|---|---|
| 4,240,967 A | 12/1980 | Bingham | 260/343.45 |
| 4,720,432 A | 1/1988 | VanSlyke et al. | 428/457 |
| 5,126,214 A | 6/1992 | Tokailin et al. | 428/690 |
| 5,693,428 A | 12/1997 | Fujii et al. | 428/690 |
| 5,756,740 A | 5/1998 | Vishwakarma et al. | 544/300 |
| 5,763,110 A | 6/1998 | Hu et al. | 428/690 |
| 5,885,498 A | 3/1999 | Matsuo et al. | 252/583 |
| 6,020,078 A | 2/2000 | Chen et al. | 428/690 |
| 6,074,734 A | 6/2000 | Kawamura et al. | 428/220 |
| 6,121,726 A | 9/2000 | Codama et al. | 313/504 |
| 6,172,264 B1 | 1/2001 | Kobayashi et al. | 564/433 |

OTHER PUBLICATIONS

Shoustikov, A. A., et al., "Electroluminescence Color Tuning by Dye Doping . . . ", IEEE Journal of Selected Topics in Quantum Electronics, vol. 4, No. 1, pp. 3–13, Jan./Feb. 1998.

*Primary Examiner*—Marie Yamnitzky
(74) *Attorney, Agent, or Firm*—Fitzpatrick, Cella, Harper & Scinto

(57) ABSTRACT

A fluorescent compound, suitable for use in an active layer of an organic light-emitting device and exhibiting both good luminescence and excellent thermal stability, which has the structure (I)

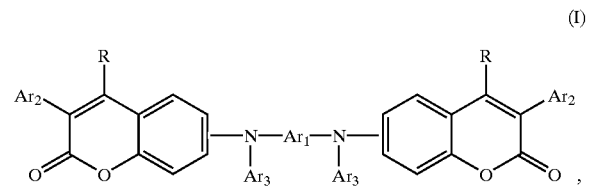

wherein R is substituted or unsubstituted alkyl; wherein $Ar_2$ is optionally present; and wherein $Ar_1$, $Ar_2$, and $Ar_3$ are independently each a substituted or unsubstituted aryl group.

9 Claims, 2 Drawing Sheets

US 6,770,385 B2

FLUORESCENT BIS-COUMARINS FOR ORGANIC LIGHT-EMITTING DEVICES

BACKGROUND OF THE INVENTION

1. Field of the Invention

The present invention relates to bipolar emitting fluorescent bis-coumarin compounds suitable for use in organic light-emitting devices (OLEDs). The invention further relates to a method of making such bis-coumarin compounds and to OLEDs employing such bis-coumarin compounds in an active layer.

2. Description of the Related Art

Coumarins are a class of well-known fluorescent compounds. They are widely used as laser dyes which can be incorporated into a variety of OLED structures and materials. Many commercially available coumarins typically contain an alkyl-substituted amino group on the phenyl ring. Although these coumarins have good photoluminescent yield, they have poor thermal stability, in that they exhibit thermal degradation even at temperatures below 400° C.

Certain bis-coumarin compounds per se are known in the art. U.S. Pat. No. 4,240,967, for example, describes a class of pigments comprising two coumarin groups linked via a biphenyl or substituted biphenyl diamine bridge; the hetero-ring serves as the attachment site for each of the coumarin groups. These bis-coumarins are not described as thermally stable and likewise are not disclosed as light-emitting materials for use in OLEDs.

Triarylamines are well-known organic hole transport materials used in OLEDs, especially N,N'-diphenyl-N,N'-di-m-tolyl-1,1'-biphenyl-4,4'-diamine (TPD), N,N'-di-1-naphthyl-N,N'-diphenyl-1,1'-biphenyl-4,4'-diamine (NPD), and their analogs.

The use of coumarins and triarylamines in OLEDs is known in the art. For example, U.S. Pat. Nos. 5,126,214, 5,693,428, 5,763,110, 6,020,078 and 6,172,264 each discloses the possible use of a conventional coumarin as an emitting material, as well as the use of a triarylamine as a hole transport material, in a given OLED. However, as indicated above, commercially available coumarins typically suffer from thermal instability. As a result, OLEDs incorporating such commercially available coumarins will exhibit reduced quantum and power efficiencies, as well as reduced life-times.

SUMMARY OF THE INVENTION

It is an object of the present invention to provide fluorescent emitting materials suitable for use in OLEDs and exhibiting excellent thermal stability and good photoluminescence.

Accordingly, in one aspect the invention is a fluorescent compound having a structure

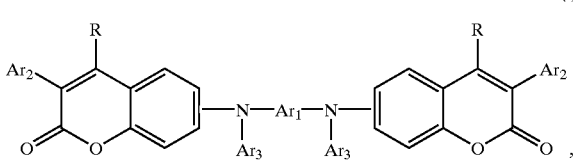

(I)

wherein R is substituted or unsubstituted alkyl; wherein $Ar_2$ is optionally present; and wherein $Ar_1$, $Ar_2$, and $Ar_3$ are independently each a substituted or unsubstituted aryl group.

In further aspects the present invention is an organic light emitting device comprising a transparent electrode; a cathode; and an active layer containing a fluorescent compound having the structure

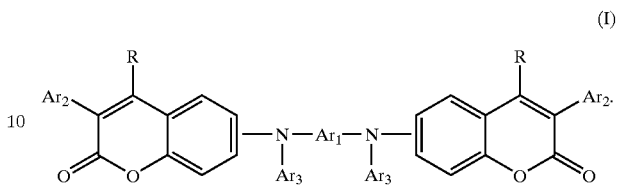

(I)

In a related aspect, the invention is a method of making a fluorescent compound having a structure

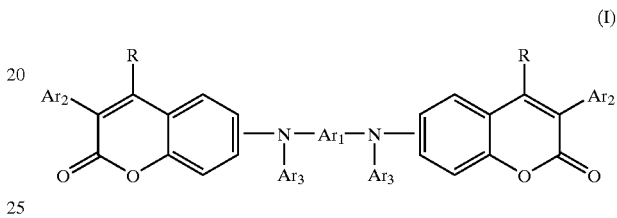

(I)

comprising the step of reacting an arylamino-substituted coumarin and a halo-substituted aryl in the presence of a catalytic metal.

This brief summary has been provided so that the nature of the invention may be understood quickly. A more complete understanding of the invention can be obtained by reference to the following detailed description of the preferred embodiments thereof in connection with the attached drawings.

DETAILED DESCRIPTION OF THE PREFERRED EMBODIMENTS

Figure 1:
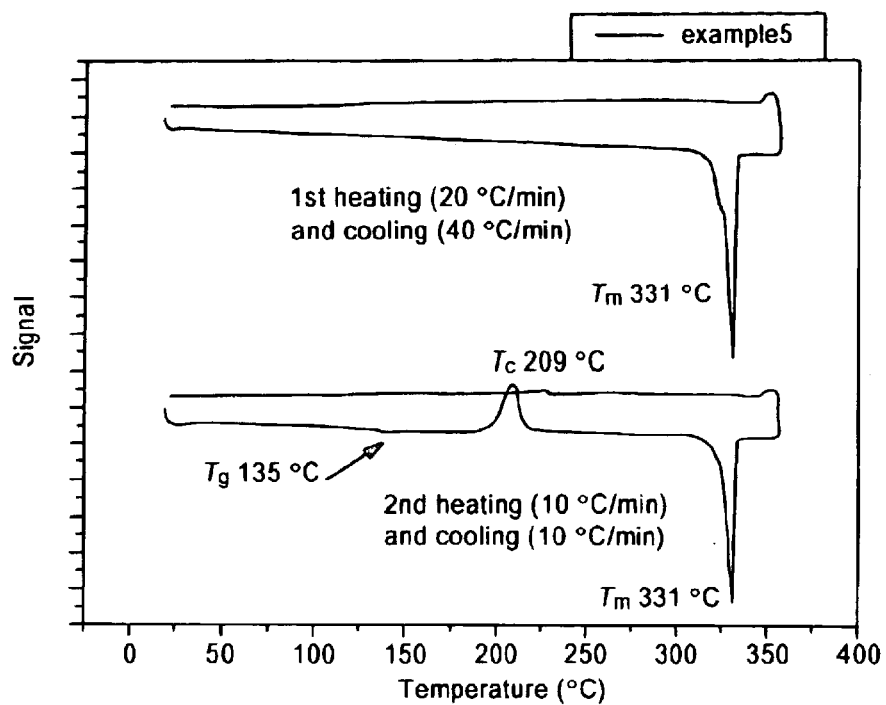
FIG. 1 is a graph showing the improved thermal characteristics of compounds within the scope of the present invention.

Accordingly, in one aspect the invention is a fluorescent compound having a structure

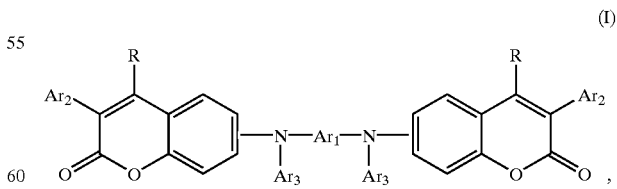

(I)

wherein R is substituted or unsubstituted alkyl; wherein $Ar_2$ is optionally present; and wherein $Ar_1$, $Ar_2$, and $Ar_3$ are independently each a substituted or unsubstituted aryl group.

In certain preferred embodiments, $Ar_1$ is selected from the group consisting of

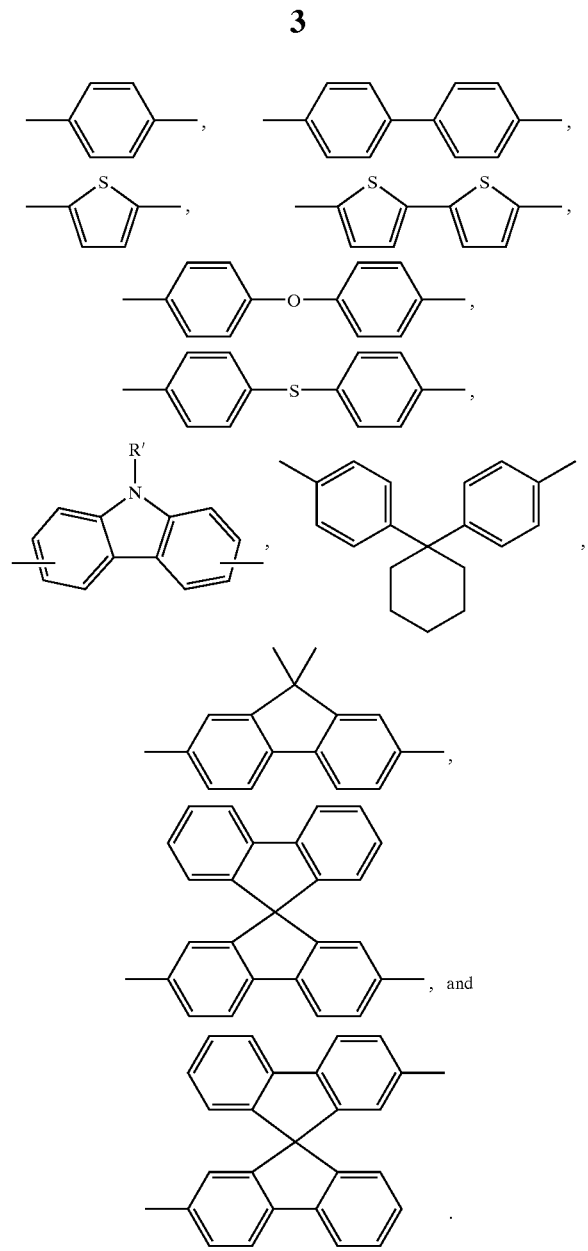

In certain other preferred embodiments, Ar$_2$ and Ar$_3$ are independently selected from the group consisting of

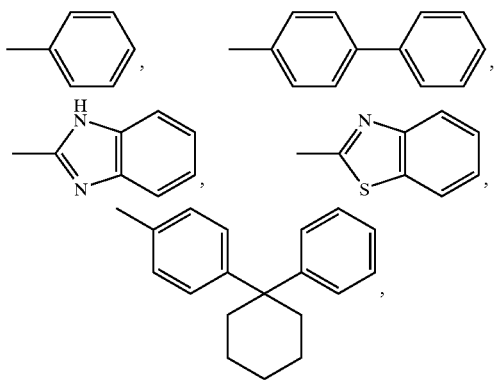

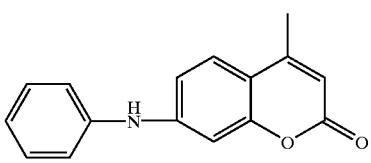

R, which can be same or different, can be —H or C$_1$–C$_{10}$ alkyl. The alkyl can be straight chain, branched or cyclic.

In still other preferred embodiments of this invention, the fluorescent compound is N,N'-diphenyl-N,N'-di-7"-(N-phenyl)-amino-3"-methyl-coumarin-1,1'-biphenyl-4,4'-diamine, N,N'-diphenyl-N,N'-di-7"-(N-p-anisole)-amino-3"-methyl-coumarin-1,1'-biphenyl-4,4'-diamine or N,N'-diphenyl-N,N'-di-7"-(N-4'-biphenyl)-amino-3"-methyl-coumarin-1,1'-biphenyl-4,4'-diamine.

The above-described fluorescent compounds exhibit excellent thermal stability and good photoluminescence. As a result, OLEDs incorporating such fluorescent compounds as light emitting materials exhibit improved quantum and power efficiencies, as well as improved life-times.

Compounds of the present invention are synthesized by reacting an arylamino substituted coumarin and a halo-substituted aryl in the presence of a catalytic metal.

Suitable catalytic metals are known to those skilled in the art and include copper and palladium catalysts. Most preferred catalysts in this invention include copper powder and bis(tri-t-butylphosphine) palladium(0).

In the halo substituted aryls of the present invention the aryl group can be selected from the same group as Ar$_1$, defined previously. The halogen may be mono- or di-substituted on the aryl group. Examples of the preferred halo-substituted aryl compounds include bromobenzene, 4-iodanisole, 4-bromo biphenyl, 9,9 dimethyl-2-bromofluorene, 1,4 diiodobiphenyl and 1,2 dichlorobenzene.

The following specific examples of fluorescent bis-coumarins and their synthesis in accordance with the present invention are for illustration purposes, and are not to be considered limiting of the invention, which is defined by the claims.

EXAMPLE 1

7-(N-Phenyl)-amino-3-methyl-Coumarin: To a flask were added 7-amino-3-methyl-coumarin (Fw. 175, 1.2 g, 6.86 mmol), K$_3$PO$_4$ (Fw. 212, 1.83 g, 8.64 mmol), bis(tri-t-butylphosphine)palladium (0) (Fw. 511, 92 mg, 0.18 mmol). The flask was evacuated and refilled with N$_2$ for three cycles. Under N$_2$, 30 mL of dry 1,4-dioxane was added, and the mixture was stirred at room temperature for 10 min. To this was added bromobenzene (Fw. 157, d 1.49, 0.76 mL, 7.2 mmol).

The solution was heated to 90° C. and stirred at this temperature for 48 h. While still hot, the solution was filtrated through a frit to remove solids. The filtrate was concentrated to its half volume. After cooling down to room temperature, the product crystallized, and was filtrated, dried at 60° C. under vacuum overnight. Yield: 0.9 g (53%). Tm (DSC): 178° C.; IR (neat), 3302 (—NH), 1700 (C=O), 1628, 1592, 1523, 1496, 1391 cm$^{-1}$.

EXAMPLE 2

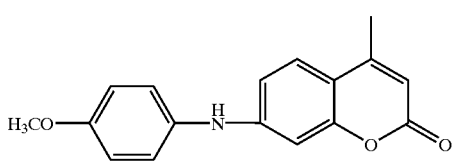

7-(N-p-Anisole)-amino-3-methyl-Coumarin: This compound was synthesized in a similar way as mentioned above (example 1), by using 4-iodoanisole in place of bromobenzene. Tm (DSC): 191° C.; IR (neat), 3303 (—NH), 1703 (C=O), 1621, 1597, 1561, 1506, 1398 cm$^{-1}$.

EXAMPLE 3

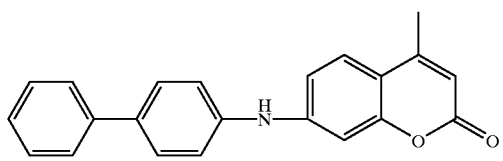

7-(N-4'-Biphenyl)-amino-3-methyl-Coumarin: This compound was synthesized in a similar way as mentioned above (example 1), by using 4-bromobiphenyl in place of bromobenzene. Tm (DSC): 225° C.; IR (neat), 3305 (—NH), 1701 (C=O), 1627, 1521, 1486, 1394 cm$^{-1}$.

EXAMPLE 4

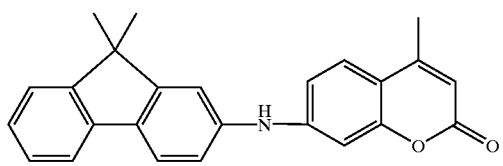

7-(N-9',9'-Dimethyl-2'-fluorenyl)-amino-3-methyl-Coumarin: This compound was synthesized in a similar way as mentioned about (example 1), by using 9,9-dimethyl-2-bromofluorene in place of bromobenzene. Tm (DSC): 210° C.; IR (neat), 3336 (—NH), 1703 (C=O), 1629, 1660, 1525, 1394 cm$^{-1}$.

EXAMPLE 5

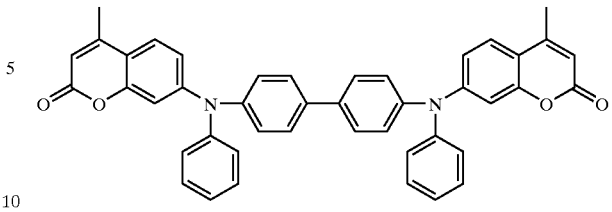

N,N'-Diphenyl-N,N'-di-7"-(N-phenyl)-amino-3"-methyl-Coumarin-1,1'-biphenyl-4,4'-diamine: 7-(N-Phenyl)-amino-3-methyl-Coumarin (Fw 251, 0.502 g, 2 mmol), 1,4-diiodobiphenyl (Fw., 406, 0.406 g, 1 mmol), copper powder (Fw 63.5, 0.127 g, 2 mmol), $K_2CO_3$ (Fw 138, 0.552 g, 4 mmol), 18-Crown-6 (Fw 264, 40 mg, 0.15 mmol) were placed in a dry round-bottle flask connected with a condenser. The system was evacuated and purged with $N_2$ for at least 2 cycles. Under $N_2$, dry 1,2-dichlorobenzene (15 mL, b.p. 180° C.) was added and the mixture was refluxed for 48 h. The hot solution was filtrated through a frit to remove solids. The filtrate was added dropwise into hexanes (250 mL) and the precipitate was filtered. The crude product was purified from a neutral Silica gel column using a mixture of Hexane/$CH_2Cl_2$/Methanol as eluents, and recrystallised twice from 1,4-dioxane, and dried at 70° C. under vacuum. Yield: 0.10 g (15%). Tm (DSC) 331° C., Tg (DSC) 135° C., Td (TGA) 452° C.

EXAMPLE 6

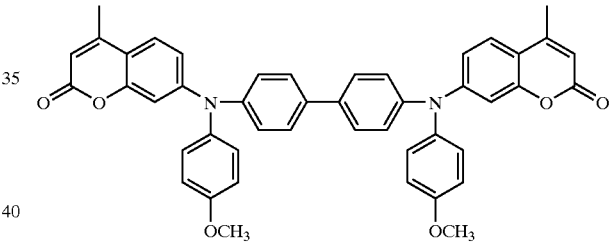

N,N'-Diphenyl-N,N'-di-7"-(N-p-anisole)-amino-3"-methyl-Coumarin-1,1'-biphenyl-4,4'-diamine: This compound is synthesized in a similar way as mentioned above (example 5), by using 7-(N-p-anisole)-amino-3-methyl-Coumarin in place of 7-(N-phenyl)-amino-3-methyl-Coumarin. Tm (DSC) 325° C., Tg (DSC) 136° C., Td (TGA) 465° C.

EXAMPLE 7

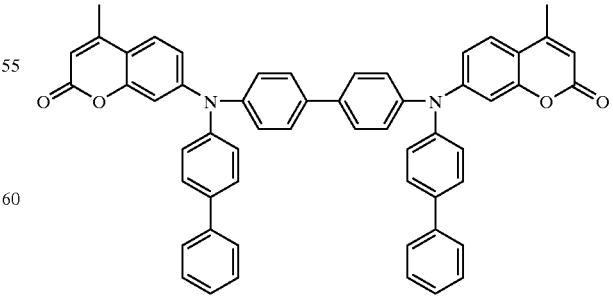

N,N'-Diphenyl-N,N'-di-7"-(N-4'-Biphenyl)-amino-3"-methyl-Coumarin-1,1'-biphenyl-4,4'-diamine: This compound is synthesized in a similar way as mentioned above (example 5), by using 7-(N-4'-biphenyl)-amino-3-methyl-Coumarin in place of 7-(N-phenyl)-amino-3-methyl-Coumarin.

The improved stability of the compounds of the present invention can be best understood by comparison with compounds which are used commercially as well as those known in the prior art, for example those disclosed in U.S. Pat. No. 6,020,078:

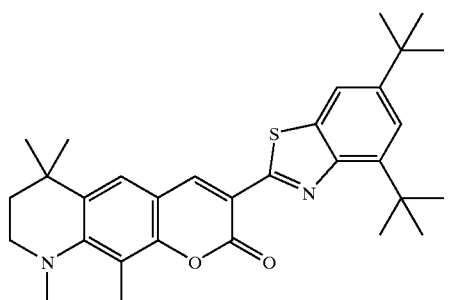

C-545TB

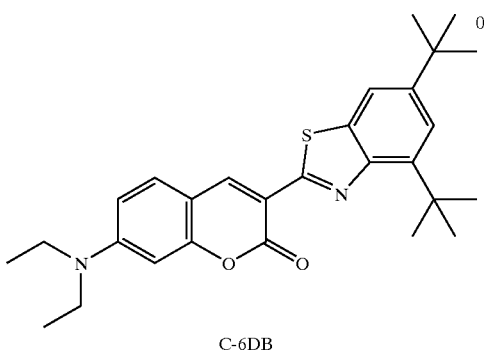

C-6DB

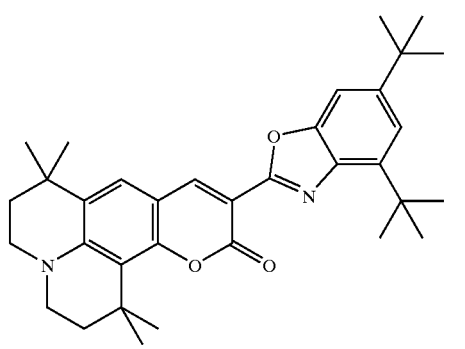

C-525TB

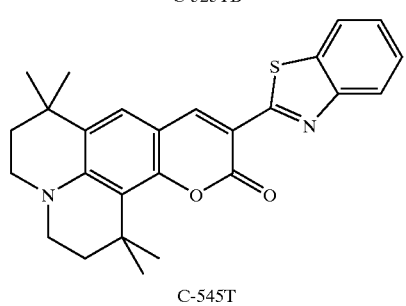

C-545T

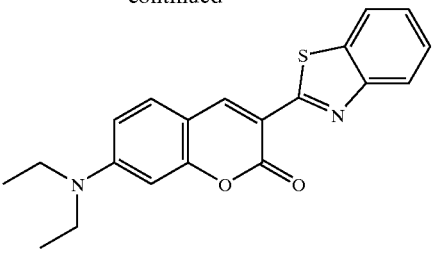

C-6

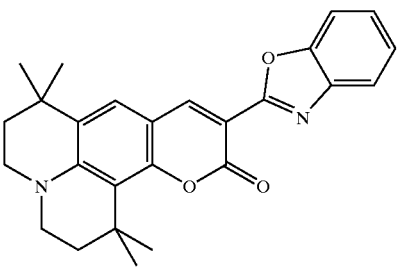

C-525T

As reported in the U.S. Pat. No. 6,020,078, these known compounds have melting points, glass transition temperatures and thermal degradation temperatures as indicated in Table 1, below. Also included in Table 1 are the Tm, Tg and Td for two compounds of the present invention, compounds 5 and 6.

Table 1. Thermal Properties Comparisons between Coumarins, according to the present invention and known Coumarins.

| Dyes | Tg | Tm | Td |
|---|---|---|---|
| C6 |  | 209 | 317 |
| C6DB | 107 | 286 | 348 |
| C545T | 100 | 230 | 318 |
| C545TB | 142 | 276 | 327 |
| C525T | 95 | 274 | 311 |
| C525TB | 118 | 252 | 318 |
| Compound 6 | 136 | 325 | 465 |
| Compound 5 | 135 | 331 | 452 |

Tg: glass transition temperature, Tm: melting point, Td thermal degradation temperature of the layer containing the compound.

The compounds of the present invention are used to dope the organic and/or polymer emissive materials used to form the active layers in OLEDs. These coumarins can be added in amounts of 0.1 wt % to 5 wt %, based on the weight of the layer containing the compound. Preferred is the use of about 1 wt.% of the compound.

FIG. 1 is a graph also demonstrating the improved thermal properties of compounds within the scope of the present invention. The compound of Example 5, N,N'-Diphenyl-N,N'-di-7"-(N-phenyl)-amino-3"-methyl-Coumarin-1,1'-biphenyl-4,4'-diamine was subjected to Differential Scanning Calorimetry (DSC) under a nitrogen atmosphere. In the first heating, the temperature was raised 20° C./min and cooling was conducted at a rate of 40° C./min. In the second heating step, the rate of heating and cooling was 10° C./min.

The melting point and glass transition temperatures were as reported in Table 1. This test also showed the compound to have a Tc of 209° C.

Figure 2:
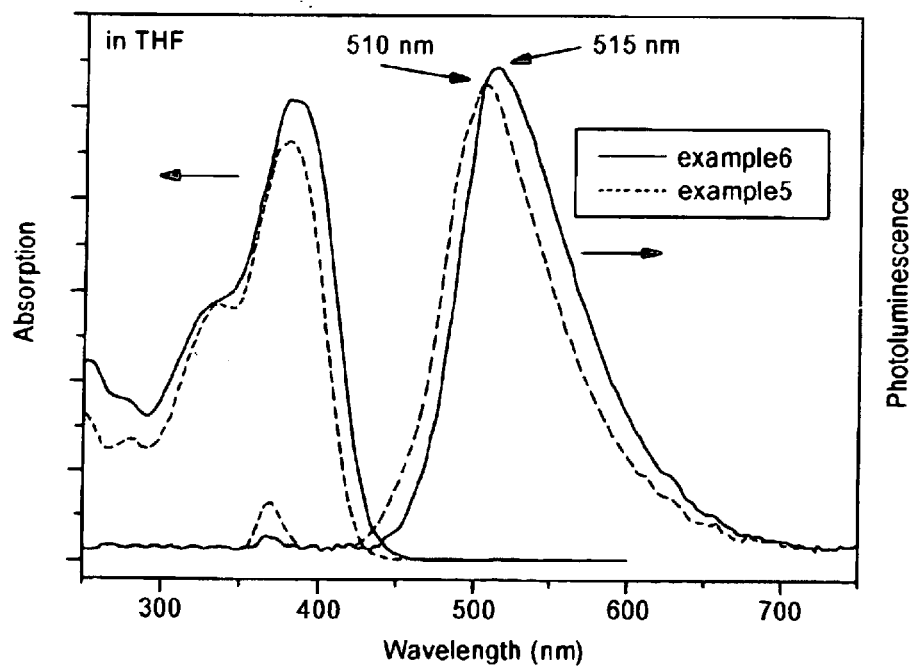
FIG. 2 shows the UV-vis and photoluminescence of compounds within the scope of the present invention.

FIG. 2 shows UV-vis and photo-luminescence (PL) of compounds 5 and 6 in THF at room temperature, showing that they are photoluminescent in the green light region.

Figure 3:
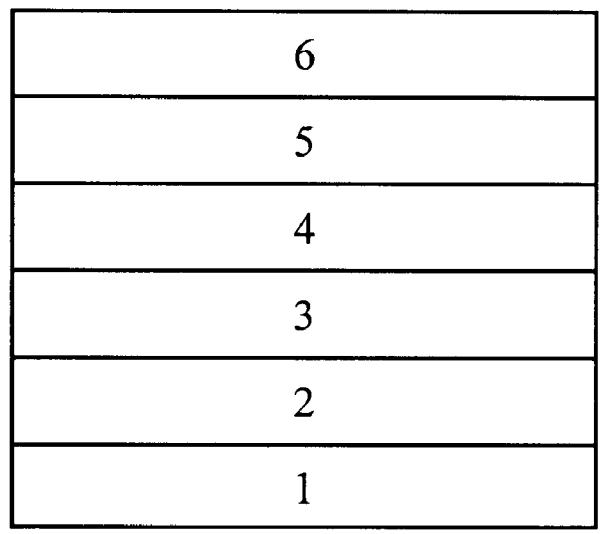
FIG. 3 is a cross-sectional view of an EL device according to the invention.

FIG. 3 schematically depicts a device according to the invention, including transparent substrate 1, anode 2 adjacent the substrate, optional hole transport layer 3 adjacent the anode, emissive layer 4, electron transport layer 5 adjacent the emissive layer, and cathode 6. Each of these layers may itself comprise multiple layers of material having similar composition or function.

Devices according to the invention find use in display applications such as television screens, computer screens and image bar components for digital copiers and printers.

Suitable materials for substrate 1 include glass, quartz and the like, and polymers (including, without limitation, polyesters, polycarbonates, polyacrylates, polymethacrylates, and polysulfones). The thickness of the substrate is not critical and can range, for example, from about 25 to over 1,000 microns, depending on the structural demands of the device.

The anode adjacent the substrate can be comprised of a metal, an alloy, an electroconducting compound, or mixtures thereof, especially with a work function equal to, or greater than about 4 electron volts. Specific examples of anodes include positive charge injecting electrodes such as indium tin oxide (ITO), tin oxide, zinc oxide, gold, platinum, electrically conductive carbon, and conjugated polymers such as polyaniline, polypyrrole, and the like. ITO is preferred. The thickness of the anode can range anywhere from about 10 nanometers to 1 micron.

The hole injecting layer may be comprised of one layer comprising one, two or more hole transport components known in the art. Any conventional known materials which can inject and transport holes into the emissive layer may be employed for forming the hole injecting layer. Preferred hole injecting and hole transporting materials include porphyrin derivatives and aromatic tertiary amines, examples of which are disclosed in U.S. Pat. No. 4,720,432, the disclosure of which is incorporated herein by reference. In embodiments, an emissive/hole transporting layer can be used instead of a hole transport layer. Thus, the hole transport layer 3 is optional.

As an optional electron transport layer any known electron transport materials can be used. A1Q type materials, such as tris-(8-hydroxyquinoline)aluminum and derivatives thereof are particularly preferred.

In embodiments of the present invention, the total thickness of the combined emissive, hole transport and electron transport layers is less than about 1 micron, and preferably is from about 400 angstroms to about 4000 angstroms, sufficient to maintain a current density that permits efficient light emission under a relatively low voltage applied across the electrodes. Suitable thickness of the layers can range preferably from about 50 to about 2,000 angstroms, and preferably from about 400 to 1,000 angstroms.

The cathode 6 can be comprised of any metal, including high or low work function metals. Aluminum, lithium, magnesium and calcium are particularly preferred.

Referring again to the reference numerals of FIG. 3, an OLED according to the invention may be made by first cleaning a glass substrate 1 having an ITO anode 2 patterned thereon in isopropyl alcohol for 5 minutes, followed by rinsing in deionized water for 5 minutes and in isopropyl alcohol again for an additional 5 minutes. The cleaned ITO substrate is placed in a substrate holder of a vacuum deposition chamber and the pressure is reduced to $2\times10^{-6}$ Pa. A layer of 4,4',4"-tris(3-methylphenylphenylamino) triphenylamine is deposited as a hole injection layer 3 by vacuum deposition. A layer of material is vacuum-deposited as emissive layer 4 containing one or more fluorescent compounds in accordance with the present invention. Electron transport layer 5 in a polymeric medium is deposited, followed by an aluminum cathode 6. A driving voltage is applied and a pure color emission is observed.

The preceding examples are provided to illustrate the invention, and are not to be considered limiting of the invention, which is defined by the following claims.

What is claimed is:

1. A fluorescent compound having a structure

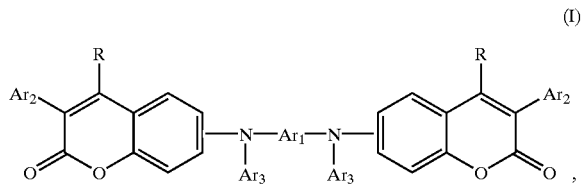

(I)

wherein R is the same or different and is selected from the group consisting of —H and $C_1$–$C_{10}$ alkyl;

wherein $Ar_2$ is optionally present;

wherein $Ar_1$ is selected from the group consisting of

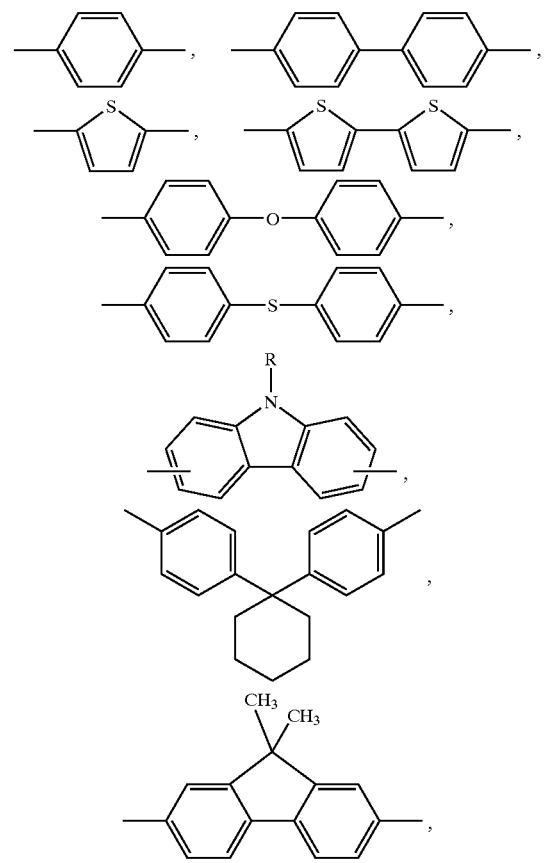

-continued

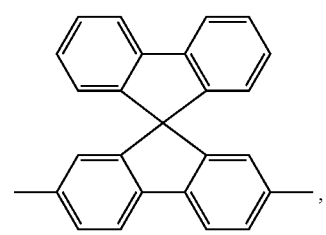

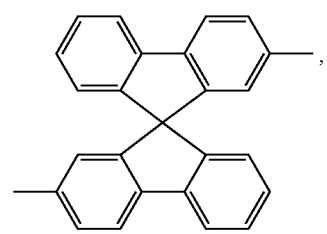

and substituted derivatives thereof; and wherein Ar$_2$ and Ar$_3$ are independently selected from the group consisting of

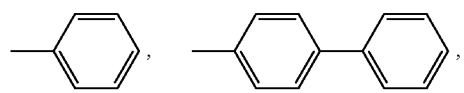

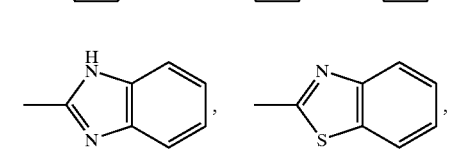

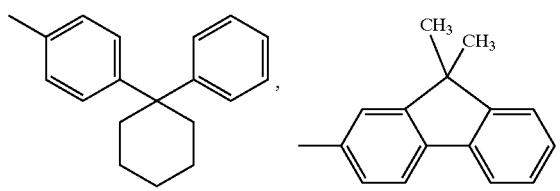

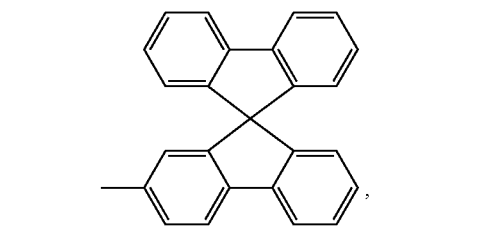

and substituted derivatives thereof.

2. The fluorescent compound according to claim 1, wherein R is CH$_3$.

3. The fluorescent compound according to claim 1, wherein the fluorescent compound is N,N'-diphenyl-N,N'-di-7"-(N-phenyl)-amino-3"-methyl-coumarin-1,1'-biphenyl-4,4'-diamine having the structure

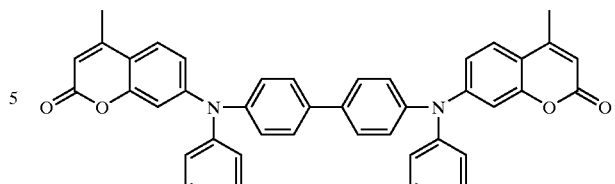

4. The fluorescent compound according to claim 1, wherein the fluorescent compound is N,N'-diphenyl-N,N'-di-7"-(N-p-anisole)-amino-3"-methyl-coumarin-1,1'-biphenyl-4,4'-diamine having the structure

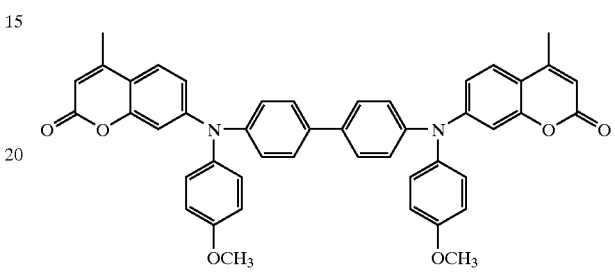

5. The fluorescent compound according to claim 1, wherein the fluorescent compound is N,N'-diphenyl-N,N'-di-7"-(N-4'-biphenyl)-amino-3"-methyl-coumarin-1,1'-biphenyl-4,4'-diamine having the structure

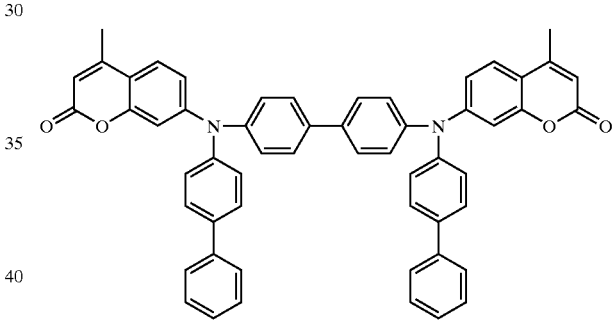

6. An organic light emitting device comprising:
   (a) a transparent anode;
   (b) a cathode; and
   (c) an emissive layer containing a fluorescent compound according to any one of claims 1–5 as a dopant.

7. The organic light emitting device according to claim 6 wherein the fluorescent compound is present in an amount of from about 0.1 to about 5 wt. % based on the weight of the emissive layer.

8. A method of making a fluorescent compound according to any one of claims 1–5 comprising the step of reacting an arylamino-substituted coumarin and a halo-substituted aryl in the presence of a catalytic metal to form the fluorescent compound.

9. The method according to claim 8, wherein the arylamino-substituted coumarin is selected from the group consisting of 7-(N-phenyl)-amino-3-methyl-coumarin, 7-(N-p-anisole)-amino-3-methyl-coumarin, 7-(N-4'-biphenyl)-amino-3-methyl-coumarin and 7-(N-9',9'-dimethyl)-2'-fluorenyl)-amino-3-methyl-coumarin.

* * * * *